(12) United States Patent
Drew et al.

(10) Patent No.: US 12,170,415 B2
(45) Date of Patent: Dec. 17, 2024

(54) PLUG-IN CONNECTOR DEVICE AND METHOD FOR PRODUCING A PLUG-IN CONNECTOR DEVICE OF THIS KIND

(71) Applicant: Vitesco Technologies GmbH, Regensburg (DE)

(72) Inventors: Gregory Drew, Munich (DE); Christian Pump, Munich (DE)

(73) Assignee: Vitesco Technologies GmbH, Regensburg (DE)

( * ) Notice: Subject to any disclaimer, the term of this patent is extended or adjusted under 35 U.S.C. 154(b) by 354 days.

(21) Appl. No.: 17/860,316

(22) Filed: Jul. 8, 2022

(65) Prior Publication Data

US 2023/0029329 A1   Jan. 26, 2023

(30) Foreign Application Priority Data

Jul. 23, 2021   (DE) .................... 10 2021 119 172.6

(51) Int. Cl.
| | |
|---|---|
| *H01R 12/58* | (2011.01) |
| *H01R 12/70* | (2011.01) |
| *H01R 12/71* | (2011.01) |
| *H05K 3/30* | (2006.01) |
| *H05K 3/34* | (2006.01) |

(52) U.S. Cl.
CPC .......... *H01R 12/58* (2013.01); *H01R 12/707* (2013.01); *H01R 12/716* (2013.01); *H05K 3/308* (2013.01); *H05K 3/3447* (2013.01); *H05K 2201/10295* (2013.01); *H05K 2201/1059* (2013.01)

(58) Field of Classification Search
CPC .... H01R 12/58; H01R 12/707; H01R 12/716; H01R 12/722; H01R 12/724; H01R 13/518; H05K 3/308; H05K 3/3447; H05K 2201/10295; H05K 2201/1059
USPC .......................................... 439/82, 540.1, 79
See application file for complete search history.

(56) References Cited

U.S. PATENT DOCUMENTS

| | | | | |
|---|---|---|---|---|
| 6,887,098 | B1* | 5/2005 | Luo ...................... | H01R 13/518 |
| | | | | 439/701 |
| 8,221,160 | B2* | 7/2012 | Liu ..................... | H01R 13/6596 |
| | | | | 439/76.1 |
| 8,721,364 | B2* | 5/2014 | Lai ..................... | H01R 13/6583 |
| | | | | 439/541.5 |
| 2008/0214045 | A1* | 9/2008 | Tu ........................ | H01R 25/003 |
| | | | | 439/540.1 |
| 2014/0030913 | A1* | 1/2014 | Chang .................. | H01R 13/658 |
| | | | | 439/540.1 |
| 2019/0199022 | A1* | 6/2019 | Masuda ................ | H01R 12/714 |
| 2019/0245284 | A1* | 8/2019 | Mukoyama .......... | H01R 12/585 |

* cited by examiner

*Primary Examiner* — Gary F Paumen
(74) *Attorney, Agent, or Firm* — Laurence A. Greenberg; Werner H. Stemer; Ralph E. Locher

(57) ABSTRACT

A plug-in connector device has a printed circuit board element, a first plug-in connector element which is electrically and mechanically connected to the printed circuit board element by a soldered connection, and a second plug-in connector element which is electrically and mechanically connected to the printed circuit board element by electrical press-in contacts. The second plug-in connector element has a housing section with a recess in which the first plug-in connector element is arranged in such a way that outer surfaces of the first plug-in connector element make contact with inner surfaces of the recess.

13 Claims, 4 Drawing Sheets

PLUG-IN CONNECTOR DEVICE AND METHOD FOR PRODUCING A PLUG-IN CONNECTOR DEVICE OF THIS KIND

CROSS-REFERENCE TO RELATED APPLICATION

This application claims the priority, under 35 U.S.C. § 119, of German Patent Application DE 10 2021 119 172.6, filed Jul. 23, 2021; the prior application is herewith incorporated by reference in its entirety.

FIELD AND BACKGROUND OF THE INVENTION

The present invention relates to a plug-in connector device, in particular for vehicles, and also to a method for producing a plug-in connector device of this kind.

The continuous further development of, for example, demanding and increasingly autonomous generations of vehicles requires increasingly more powerful plug-in connector devices. Devices of this kind are indispensable if, for example, the aim is to sense the area surrounding the vehicle using corresponding environment sensors and to pass on the sensor data sensed in this way to, for example, assistance systems of the vehicle.

However, it has been found that there are a large number of different types of plug-in connector elements, which can preferably be jointly integrated in a plug-in connector device. Examples include plug-in connector elements which are connected to a printed circuit board element by means of a soldered connection, as well as plug-in connector elements which are connected to the printed circuit board element by means of press-in contacts. It is desirable to be able to easily and reliably combine different types of plug-in connector elements in a common, modular plug-in connector device.

SUMMARY OF THE INVENTION

The object of the present invention is therefore to provide a plug-in connector device, in particular for a vehicle, in which plug-in connector elements of different types can be used together. It is furthermore an object of the present invention to provide a method for producing a plug-in connector device of this kind.

These objects are achieved by a plug-in connector device as claimed in the independent plug-in connector patent claim and by a method as claimed in the independent method patent claim. The dependent claims relate to advantageous refinements.

According to a first aspect of the present invention, a plug-in connector device, in particular for a vehicle, is provided. The plug-in connector device contains a printed circuit board element, a first plug-in connector element which is electrically and mechanically connected to the printed circuit board element by means of a soldered connection, and a second plug-in connector element which is electrically and mechanically connected to the printed circuit board element by means of electrical press-in contacts. In this case, the second plug-in connector element has a housing section with a recess in which the first plug-in connector element is arranged in such a way that outer surfaces of the first plug-in connector element make contact with inner surfaces of the recess.

The plug-in connector device according to the invention is at least partially based on the finding that a plug-in connector element, which is connected to the printed circuit board element by means of a soldered connection, can be, in a sense, received and protected by a recess in a housing section of the other plug-in connector element. Particularly if the first plug-in connector element is received flush in the recess of the housing section, so that the first plug-in connector element does not protrude beyond the recess of the housing section of the second plug-in connector element, the contact areas by way of which the respective plug-in connector element is arranged on the printed circuit board element are oriented in alignment with one another. Since, in addition, the outer surfaces of the first plug-in connector element are in contact with the inner surfaces of the recess, a plug-in connector device is created, in which the first plug-in connector element is, in a sense, protected by the housing section of the second plug-in connector element. Since the inner surfaces of the recess can be matched to the outer surfaces of the first plug-in connector element, different sizes and types of first plug-in connector elements can be used in the plug-in connector device, depending on the application. This creates a plug-in connector device which, in a sense, provides different types of plug-in connector elements in a common device in a modular manner.

In a preferred refinement of the plug-in connector device according to the invention, the outer surfaces of the first plug-in connector element make contact with the inner surfaces of the recess in a fluid-tight manner. This preferred refinement is at least partially based on the finding that an ingress of fluids into the recess in the housing section and therefore between the two plug-in connector elements is effectively prevented owing to fluid-tight contact between the outer surfaces of the first plug-in connector element and the inner surfaces of the recess. For example, the outer surfaces of the first plug-in connector element can be equipped with sealing lips or other sealing elements which ensure fluid-tight contact with the inner surfaces of the recess. Owing to the fluid-tight contact between the inner and outer surfaces, the field of application of the plug-in connector device according to the invention can be expanded. For example, a plug-in connector device configured in this way can then also be used outside, for example, a passenger area of a vehicle, for example in an engine compartment.

It is particularly advantageous if a sealing element is arranged between the inner surfaces of the recess and the outer surfaces of the first plug-in connector element. A sealing element not only increases the sealing effect between the inner and outer surfaces but also allows manufacturing or production tolerances of the plug-in connector elements to be compensated for.

A further preferred refinement makes provision for the first plug-in connector element to have a shape which tapers in the direction of the housing section. In other words, the first plug-in connector element has a shape which tapers as the distance from the printed circuit board element increases. Accordingly, the recess in the housing section has a shape which widens in a corresponding manner as the distance from the printed circuit board element decreases. This preferred refinement is at least partially based on the finding that the housing section of the second plug-in connector element can be easily and more reliably plug-mounted onto a shape of the first plug-in connector element tapering in the direction of the housing section. This is advantageous particularly for the production of a plug-in connector device of this kind.

It is particularly advantageous if the tapering shape of the first plug-in connector element is trapezoidal. This particularly preferred refinement is at least partially based on the finding that, in particular in a cross-sectional plane perpendicular to a main plane of extent of the printed circuit board element, a trapezoidal shape of the first plug-in connector element, wherein the trapezoidal shape has two side surfaces running toward one another and a cover surface connecting the two side surfaces, is particularly highly suitable for plug-mounting the second plug-in connector element.

A further preferred refinement of the plug-in connector device according to the invention makes provision for the first plug-in connector element to have metallic signal shielding for a signal of a (plug-in) component susceptible to interference. A plug-in connector element of this kind is, for example, a data transmission plug-in connector element, in particular a high-speed data transmission plug-in connector element, further in particular a digital high-speed data transmission plug-in connector element which has, in particular, transmission rates in the megabit/s and/or gigabit/s range. One example of a digital high-speed data transmission plug-in connector element is an Ethernet plug-in connector element which has metallic signal shielding around the electrical plug-in contacts. Plug-in connector elements of this kind are used, for example, for transmitting data from, for example, an environment sensor system of the vehicle to, for example, an assistance system of the vehicle. Plug-in connector elements of this kind are usually provided as prefabricated plug-in connector elements which are connected to the printed circuit board element by means of a soldered connection. Plug-in connector elements of this kind, in particular in the high-speed range, are susceptible to faults, for example on account of the signal bandwidths and quantities of data to be transmitted, and therefore usually require good electromagnetic shielding as well as an impedance of the plug-in connector element matched to the data transmission. Both points can best be satisfied in accordance with the current prior art in a cost-effective manner by means of the soldered connection to the printed circuit board element discussed. The plug-in connector device according to the invention therefore also allows, in particular, plug-in connector elements, such as Ethernet plug-in connector elements for example, that are susceptible to faults to be combined with other plug-in connector elements which are connected to the printed circuit board element by means of press-in contacts. This creates a particularly flexible and modular plug-in connector device which can also integrate the most modern plug-in connector elements without problems A further preferred refinement of the plug-in connector device according to the invention makes provision for the first plug-in connector element to have a first plug section for making contact with a first (plug-in) component and the second plug-in connector element to have a second plug section for making contact with a second (plug-in) component. The first plug section and the second plug section are arranged in such a way that the first component and the second component can be plugged onto the first and, respectively, the second plug section in the same plug-in direction. In other words, the first and the second plug section are arranged in such a way that they can receive a respective (plug-in) component in the same plug-in direction. Therefore, components can be plug-mounted onto the plug-in connector device in the same plug-in direction, this being advantageous particularly in a vehicle given limited installation space conditions.

It is particularly preferred if the plug-in direction runs in a manner inclined with respect to a main plane of extent of the printed circuit board element. The main plane of extent of the printed circuit board element is usually the fitting plane of the printed circuit board element. This particularly preferred refinement has the advantage that, for example, the plug-in connector device can be installed in a depression in a housing and the components can be plug-mounted, for example, obliquely from above onto the respective plug section of the device. As an alternative, provision is made for the plug-in direction to run parallel to the main plane of extent of the printed circuit board element. In this case, the plug-in connector device is particularly installation space-saving since the components can be inserted parallel to the main plane of extent of the printed circuit board element. Since, in particular, a press-in direction of the electrical press-in contacts of the second plug-in connector element runs perpendicularly to the main plane of extent of the printed circuit board element, the electrical contacts of the second plug-in connector element are arranged at 90° given a parallel course of the plug-in direction with respect to the main plane of extent. As a result, for each application, the suitable plug-in connector device for the application can be created with the respectively most favorable plug-in direction for this application.

According to a further refinement of the plug-in connector device according to the invention, the housing section of the second plug-in connector element has sealing surfaces for a housing arranged around the second plug-in connector element. Therefore, the second plug-in connector element can also be protected against external influences, for example, by means of an enclosure.

According to a second aspect of the invention, a method for producing a plug-in connector device according to the first aspect or refinements thereof is provided. The method according to the second aspect contains the following steps: providing the printed circuit board element, applying the first plug-in connector element to the printed circuit board element in such a way that the first plug-in connector element is electrically and mechanically connected to the printed circuit board element by means of a soldered connection, applying the second plug-in connector element to the printed circuit board element in such a way that the electrical press-in contacts of the second plug-in connector element are pressed into holes in the printed circuit board element for the purpose of making electrical and mechanical contact with the printed circuit board element and the first plug-in connector element is arranged in the recess in the housing section of the second plug-in connector element in such a way that the outer surfaces of the first plug-in connector element make contact with the inner surfaces of the recess.

In a preferred refinement of the method according to the invention, after the first plug-in connector element is applied and before the second plug-in connector element is applied, a sealing element is applied between the outer surfaces of the first plug-in connector element and the inner surfaces of the recess. Therefore, the outer surfaces of the first plug-in connector element make contact with the inner surfaces of the recess in a fluid-tight manner.

The sealing element is preferably a dispenser sealing element and the dispenser sealing element is applied by means of a dispenser method. The dispenser method has, in particular, manufacturing-related advantages since the sealing element can be easily matched to the respective shape of the first plug-in connector element using said dispenser method.

Preferred refinements of the plug-in connector device according to the invention can also be used in preferred refinements of the method according to the invention, and vice versa.

Other features which are considered as characteristic for the invention are set forth in the appended claims.

Although the invention is illustrated and described herein as embodied in a plug-in connector device and a method for producing a plug-in connector device of this kind, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Elements of the same design or function are provided with the same reference signs throughout the figures.

Figure 1:
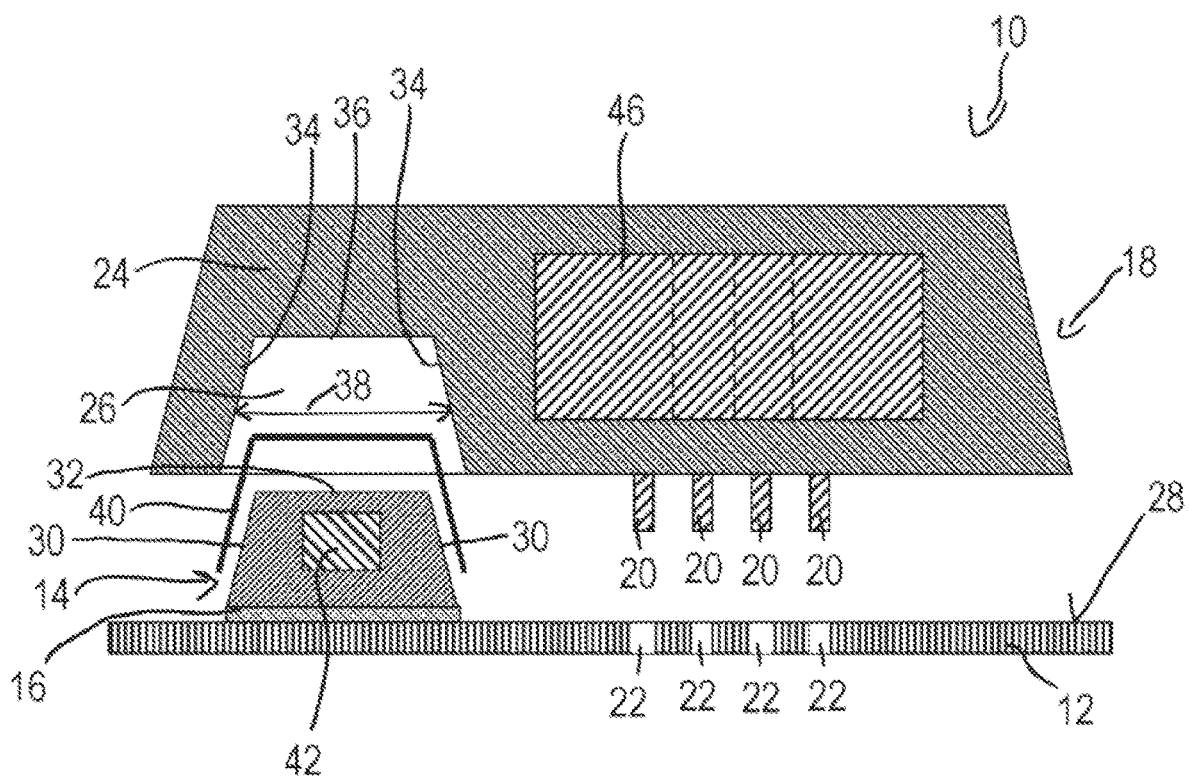
FIG. 1 is a diagrammatic, sectional view of an embodiment of a plug-in connector device according to the invention in a not fully assembled state.

Referring now to the figures of the drawings in detail and first, particularly to FIG. 1 thereof, there is shown a schematic sectional view of a plug-in connector device 10 in a not fully assembled state. The plug-in connector device 10 can be used, for example, in a vehicle and for connection to (plug-in) components of the vehicle.

The plug-in connector device 10 has a printed circuit board element 12. The printed circuit board element 12 can be any desired printed circuit board element, such as for example an FR4 printed circuit board element or another printed circuit board element known to a person skilled in the art.

The plug-in connector device 10 according to the invention furthermore has a first plug-in connector element 14. The first plug-in connector element 14 is a plug-in connector element which is electrically and mechanically connected to the printed circuit board element 12 by means of a soldered connection. In the specific example of FIG. 1, the soldered connection between the first plug-in connector element 14 and the printed circuit board element 12 is schematically indicated by means of solder layer 16. It goes without saying that other soldered connections between the first plug-in connector element 14 and the printed circuit board element 12 are possible. It is essential for the first plug-in connector element 14 to be connected to the printed circuit board element 12 by means of a soldered connection.

In addition to the first plug-in connector element 14, the plug-in connector device 10 further has a second plug-in connector element 18. In contrast to the first plug-in connector element 14, the second plug-in connector element 18 is electrically and mechanically connected to the printed circuit board element 12 by means of electrical press-in contacts 20. For this purpose, the electrical press-in contacts 20 are pressed into holes 22 formed in a manner corresponding to the printed circuit board element 12.

Therefore, the plug-in connector device 10 has two different types of plug-in connector elements. One plug-in connector element, specifically the first plug-in connector element 14, is a plug-in connector element which is connected to the printed circuit board element 12 by means of a soldered connection and a further plug-in connector element, specifically the second plug-in connector element 18, is a plug-in connector element which is connected to the printed circuit board element 12 by means of press-in contacts 20. In the assembled state which is described in more detail in conjunction with FIG. 2, both plug-in connector elements 14, 18 are electrically and mechanically connected to the printed circuit board element 12.

In the specific example of FIG. 1, the first plug-in connector element 14 is a plug-in connector element with metallic signal shielding for a signal susceptible to interference, in particular a data transmission plug-in connector element such as for example an Ethernet plug-in connector element. The data transmission plug-in connector element transmits data between, for example, an environment sensor system of the vehicle and an assistance system of the vehicle. The data transmission plug-in connector element can be a high-speed data transmission plug-in connector element which transmits data in the megabit/s or gigabit/s range. The data transmission plug-in connector element has to meet particular requirements in respect of electromagnetic shielding and also an impedance matched to the data transmission. Both can best be achieved in accordance with the current prior art in a cost-effective manner by means of the described soldered connection on the printed circuit board element 12.

In contrast, the second plug-in connector element 18 is not actually a data transmission plug-in connector element but rather a different plug-in connector element which, for example, transmits current and/or (high) voltage and is connected to the printed circuit board element 12 by way of press-in contacts 20 which are common in practice.

As is clearly shown in FIG. 1, the second plug-in connector element 18 has a housing section 24 with a recess 26. The recess 26 is formed in the housing section 24 in such a way that it can fully receive the first plug-in connector element 14 in an assembled state, as described in more detail in conjunction with FIG. 2.

A shape of the first plug-in connector element 14 has a shape which tapers as the distance from a main plane of extent 28 of the printed circuit board element 12 increases. In the specific example of FIG. 1, the tapering shape is a trapezoidal shape. In the sectional view of FIG. 1, the trapezoidal shape contains two side surfaces 30 running obliquely with respect to the main plane of the sensor 28 and toward one another and a cover surface 32 connecting the two side surfaces 30. In the specific example of FIG. 1, the trapezoidal shape is such that the cover surface 32 runs substantially parallel to the main plane of extent 28 of the printed circuit board element 12. It goes without saying that the cover surface 32 can run, in other embodiments not shown and then not necessarily trapezoidal, in an inclined manner with respect to the main plane of extent 28, for example. It is essential for the shape of the first plug-in connector element 14 to have a tapering shape as the distance from the main plane of extent 28 increases.

In contrast, it is clearly shown in FIG. 1 that a shape of the recess 26 of the housing section 24 is a shape matched to the shape of the first plug-in connector element 14. Therefore, in the specific example of FIG. 1, the recess 26 has two side surfaces 34 and a cover surface 36 in the sectional view of FIG. 1. The two side surfaces 34 likewise run obliquely with respect to the main plane of extent 28 of the printed circuit board element 12 but are arranged in such a way that they are at an increasingly large distance 38 from one another as the distance from the main plane of extent 28 decreases. The cover surface 36 of the recess 26 once again runs substantially parallel to the main plane of extent 28, but can also run obliquely with respect to the main plane of extent 28 in other embodiments, not shown.

As is likewise shown in FIG. 1, the plug-in connector device 10 has a sealing element 40. The sealing element 40 is arranged between the first plug-in connector element 14 and the recess 26 and is used to seal off a gap which may possibly be present between the outer surfaces 30, 32 of the first plug-in connector element 14 and the inner surfaces 34, 36 of the recess 26 in the assembled state. In the specific example of FIG. 1, the sealing element 40 is a dispenser sealing element and is applied to the outer surfaces 30, 32 of the second plug-in connector element 14 by means of a dispenser method for example.

The first plug-in connector element 14 has a first plug section 42 by way of which a connection to a first (plug-in) component 44 (see FIG. 3) can be established. The second plug-in connector element 18 has a second plug section 46 by way of which a connection to a second (plug-in) component 48 (likewise see FIG. 3) can be established.

Figure 2:
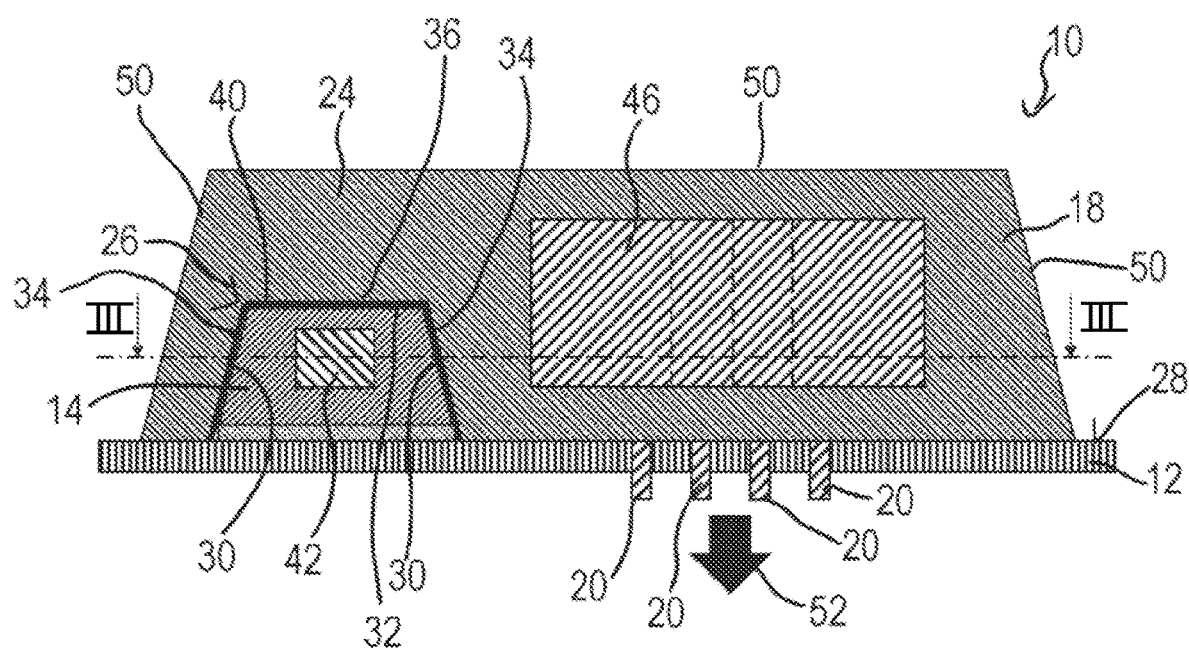
FIG. 2 is a sectional view of the embodiment of FIG. 1 in a fully assembled state.

Reference is now made to FIG. 2, which shows the plug-in connector device 10 of FIG. 1 in an assembled state.

As shown in FIG. 2, the first plug-in connector element 14 is arranged in the recess 26 in the housing section 24. The sealing element 40 is arranged between the first plug-in connector element 14 and the recess 26 and establishes fluid-tight contact between the outer surfaces 30, 32 of the first plug-in connector element 14 and the inner surfaces 34, 36 of the recess 26. Furthermore, the first plug-in connector element 14 is fully received in the recess 16, so that the first plug-in connector element 14 does not protrude beyond the recess 26.

The housing section 24 of the second plug-in connector element 18 furthermore has surfaces 50 which can be used as sealing surfaces for a housing (not shown) arranged around the second plug-in connector element 18.

As shown in FIG. 2, the electrical press-in contacts 20 of the second plug-in connector element 18 are pressed into the corresponding holes in the printed circuit board element 12 in a press-in direction provided with reference sign 52. In this case, the press-in direction 52 is perpendicular to the main plane of extent 28 of the printed circuit board element 12, as is well known to a person skilled in the art for connections of this kind.

Figure 3:
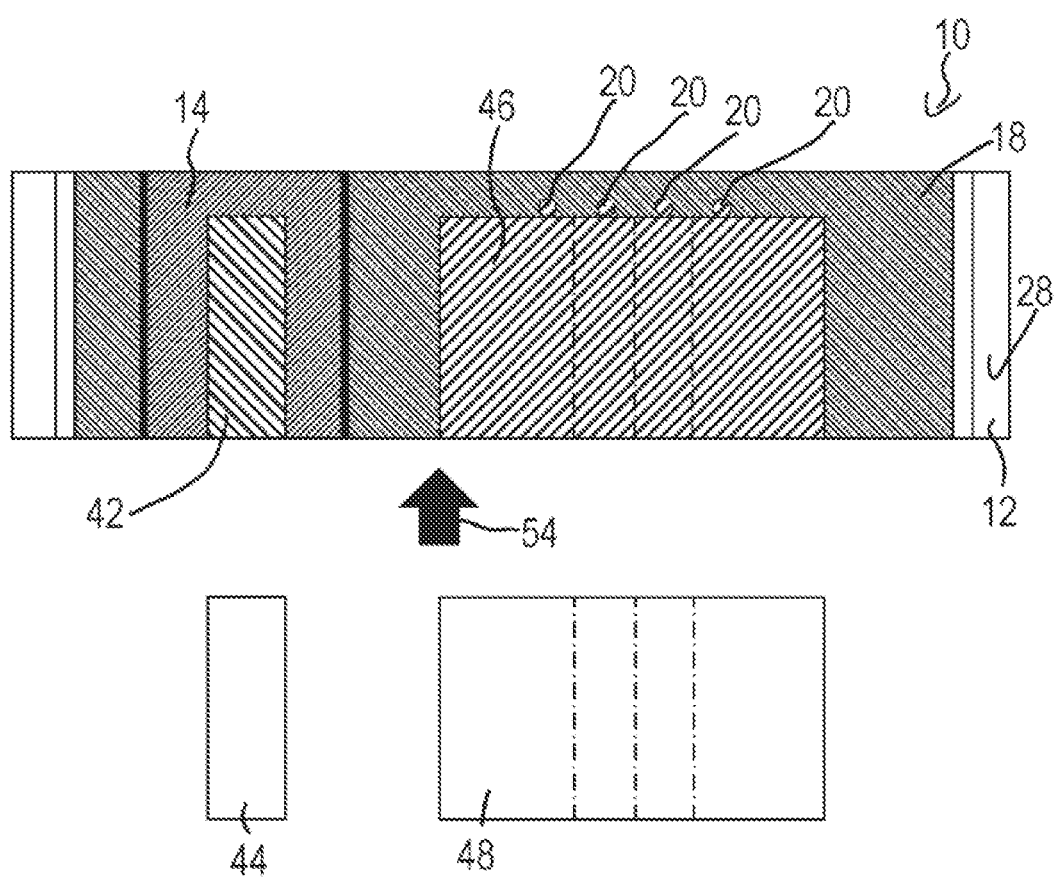
FIG. 3 is a schematic sectional view of the embodiment of FIG. 1 taken along section line III-Ill of FIG. 2.

Reference is now made to FIG. 3 which shows a schematic sectional view of the plug-in connector device 10 along section line III-III of FIG. 2.

As shown in FIG. 3, the first plug section 42 of the first plug-in connector element 14 and the second plug section 46 of the second plug-in connector element 18 are arranged in such a way that the respective (plug-in) component 44, 48 can be plugged onto the plug sections 42, 46 along the same plug-in direction provided with reference sign 54. As likewise indicated in FIG. 3, the second plug section 46 in particular can in this case have subsections which are indicated by dashed lines, so that in particular separate, second (plug-in) components 48 can be plug-mounted onto the respective subsections of the second plug section 46. It is of course feasible in principle for the first plug section 42 to also be able to have a plurality of subsections for a plurality of separate, first (plug-in) components 44.

As shown by comparing FIGS. 2 and 3, the plug-in direction 54 runs parallel to the main plane of extent 28 of the printed circuit board element 12 and additionally perpendicular to the press-in direction 52 in the specific example of FIG. 2 and FIG. 3. The result of this is that the press-in contacts 20 ultimately establish a 90° connection between the printed circuit board element 12 and the second plug section 46. It goes without saying that in other embodiments, not shown, the plug-in direction 54 can run not in parallel but rather in an inclined manner with respect to the main plane of extent 28 of the printed circuit board element 12, depending on the application for which the plug-in connector device 10 is intended.

Figure 4:
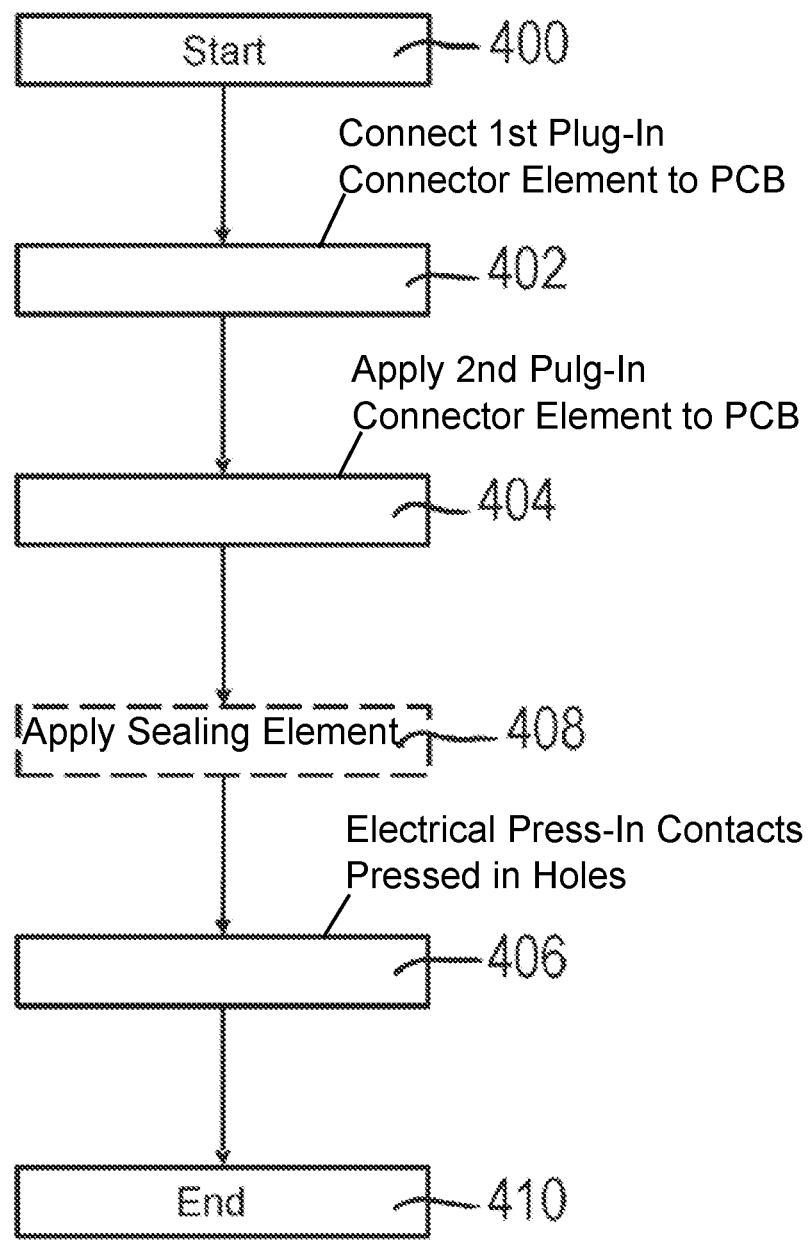
FIG. 4 is a flow chart showing a process steps for carrying out an embodiment of a method according to the invention for producing a plug-in connector device.

Finally, reference is made to FIG. 4 which shows a schematic view of process steps for carrying out a method for producing the plug-in connector device 10 of FIGS. 1 to 3.

The method starts with the step 400.

In the subsequent step 402, the printed circuit board element 12 is provided.

In the subsequent step 404, the first plug-in connector element 14 is applied to the printed circuit board element 12 in such a way that the first plug-in connector element 14 is electrically and mechanically connected to the printed circuit board element 12 by means of a soldered connection, which is indicated by means of the solder layer 16 by way of example in FIG. 1.

In a subsequent step 406, the second plug-in connector element 18 is applied to the printed circuit board element 12 in such a way that the electrical press-in contacts 20 of the second plug-in connector element 18 are pressed into the holes 22 in the printed circuit board element 12 and the first plug-in connector element 14 is arranged in the recess 26 in the housing section 24 of the second plug-in connector element 18 in such a way that the outer surfaces 30, 32 of the first plug-in connector element 14 are in contact with the inner surfaces 34, 36 of the recess 26.

In an optional step 408 which takes place after the step 404 and before the step 406, the sealing element 40 can be applied to the outer surfaces 30, 32 of the first plug-in connector element 14, for example by means of a dispenser method, in order to establish fluid-tight contact between the outer surfaces 30, 32 and the inner surfaces 34, 36.

The method finally ends with the step 410.

Although the impression could be created in conjunction with FIG. 3 that the first and the second plug-in connector element 14, 18 extend over the entire width (direction from bottom to top of FIG. 3) of the printed circuit board element 12, the plug-in connector elements 14, 18 can actually only extend over a portion of the width of the printed circuit board element 12. In other words, the printed circuit board elements 12 can be wider than the plug-in connector elements 14, 18.

The invention claimed is:

1. A plug-in connector device, comprising:
a printed circuit board element;
a soldered connection;
a first plug-in connector element being electrically and mechanically connected to said printed circuit board element by means of said soldered connection; and
a second plug-in connector element having electrical press-in contacts and being electrically and mechanically connected to said printed circuit board element by means of said electrical press-in contacts and further having a housing section with a recess formed therein and in said recess said first plug-in connector element is disposed such that outer surfaces of said first plug-in connector element make contact with inner surfaces of said housing section defining said recess.

2. The plug-in connector device according to claim 1, wherein said outer surfaces of said first plug-in connector element make contact with said inner surfaces of said housing section defining said recess in a fluid-tight manner.

3. The plug-in connector device according to claim 2, further comprising a sealing element disposed between said inner surfaces of said housing section defining said recess and said outer surfaces of said first plug-in connector element.

4. The plug-in connector device according to claim 1, wherein said first plug-in connector element has a shape which tapers in a direction of said housing section.

5. The plug-in connector device according to claim 4, wherein said shape which tapers is trapezoidal.

6. The plug-in connector device according to claim 1, wherein said first plug-in connector element has metallic signal shielding for a signal of a plug-in component.

7. The plug-in connector device according to claim 1, wherein said first plug-in connector element has a first plug section for making contact with a first component and said second plug-in connector element has a second plug section for making contact with a second component, wherein said first plug section and said second plug section are disposed such that the first component and the second component can be plugged onto said first plug section and said second plug section in a same plug-in direction.

8. The plug-in connector device according to claim 7, wherein said first plug section and said second plug section are disposed such that the same plug-in direction runs in a manner inclined with respect to a main plane of extent of said printed circuit board element.

9. The plug-in connector device according to claim 7, wherein said first plug section and said second plug section are disposed such that the same plug-in direction runs parallel to a main plane of extent of said printed circuit board element.

10. The plug-in connector device according to claim 1, wherein said housing section of said second plug-in connector element has sealing surfaces for a housing disposed around said second plug-in connector element.

11. A method for producing a plug-in connector device, which comprises the following steps of:
providing a printed circuit board element;
applying a first plug-in connector element to the printed circuit board element such that the first plug-in connector element is electrically and mechanically connected to the printed circuit board element by means of a soldered connection; and
applying a second plug-in connector element to the printed circuit board element such that electrical press-in contacts of the second plug-in connector element are pressed into holes in the printed circuit board element for making electrical and mechanical contact with the printed circuit board element and the first plug-in connector element is disposed in a recess in a housing section of the second plug-in connector element such that outer surfaces of the first plug-in connector element make contact with inner surfaces of the recess.

12. The method according to claim 11, wherein after the first plug-in connector element is applied and before the second plug-in connector element is applied, applying a sealing element between the outer surfaces of the first plug-in connector element and the inner surfaces of the housing section defining the recess.

13. The method according to claim 12, wherein the sealing element is a dispenser sealing element and the dispenser sealing element is applied by means of a dispenser method.

* * * * *